United States Patent
Takewaki et al.

(10) Patent No.: US 10,415,136 B2
(45) Date of Patent: Sep. 17, 2019

(54) SUBSTRATE PROCESSING APPARATUS INCLUDING HEATING AND COOLING DEVICE, AND CEILING PART INCLUDED IN THE SAME

(71) Applicant: HITACHI KOKUSAI ELECTRIC INC., Tokyo (JP)

(72) Inventors: Motoya Takewaki, Toyama (JP); Tetsuya Kosugi, Toyama (JP); Masaaki Ueno, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 496 days.

(21) Appl. No.: 15/260,907

(22) Filed: Sep. 9, 2016

(65) Prior Publication Data
US 2016/0376701 A1    Dec. 29, 2016

Related U.S. Application Data

(63) Continuation of application No. PCT/JP2015/058303, filed on Mar. 19, 2015.

(30) Foreign Application Priority Data

Mar. 20, 2014 (JP) ................. 2014-058323

(51) Int. Cl.
*H01L 21/67* (2006.01)
*C23C 16/44* (2006.01)
*C23C 16/46* (2006.01)

(52) U.S. Cl.
CPC ...... *C23C 16/4411* (2013.01); *C23C 16/4412* (2013.01); *C23C 16/466* (2013.01); *H01L 21/67109* (2013.01)

(58) Field of Classification Search
CPC ......... C30B 25/00; C30B 25/02; C30B 25/10; C30B 25/16; C30B 25/14; C23C 16/44;
(Continued)

(56) References Cited

U.S. PATENT DOCUMENTS

| | | | |
|---|---|---|---|
| 2009/0014428 A1* | 1/2009 | Hayashida | F27B 17/0025 219/390 |
| 2012/0006506 A1* | 1/2012 | Murata | C23C 16/46 165/59 |
| 2014/0287375 A1 | 9/2014 | Kosugi et al. | |

FOREIGN PATENT DOCUMENTS

| JP | 2005-286051 A | 10/2005 |
|---|---|---|
| JP | 2005286051 A | * 10/2005 |

(Continued)

OTHER PUBLICATIONS

International Search Report, PCT/JP2015/058303, dated Jun. 9, 2015, 2 pgs.
(Continued)

Primary Examiner — Kenneth A Bratland, Jr.
(74) Attorney, Agent, or Firm — Volpe and Koenig, P.C.

(57) ABSTRACT

A substrate processing apparatus includes a reaction tube processing a substrate, a heating part disposed on an outside of the reaction tube that heats the interior of the reaction tube, an insulating part disposed on an outside of the heating part, a plurality of flow channels installed in the insulating part and allows an air or a cooling medium to flow, and a ceiling part configured to cover an upper surface of the insulating part. The ceiling part includes a first member having a supply hole formed to communicate with the flow channels and to supply the air or cooling medium into the flow channels, and a second member having a space formed between the second member and the first member and allowing the air or the cooling medium to flow therein and having a partition part to partition the space into at least two spaces.

12 Claims, 12 Drawing Sheets

(58) Field of Classification Search
CPC . C23C 16/4411; C23C 16/4412; C23C 16/46; C23C 16/463; C23C 16/466; H01L 21/67109; H01L 21/67
USPC ....... 117/84, 88–89, 93, 105, 200–202, 204; 118/715, 722, 724
See application file for complete search history.

(56) References Cited

FOREIGN PATENT DOCUMENTS

| | | |
|---|---|---|
| JP | 2008202912 A2 | 9/2008 |
| JP | 2009-004715 A | 1/2009 |
| JP | 2010-093108 A | 4/2010 |
| JP | 2012-033871 A | 2/2012 |
| JP | 2014-209569 A | 11/2014 |
| KR | 20120005977 A | 1/2012 |
| WO | 2008/099449 A1 | 8/2008 |
| WO | 2013/141371 A1 | 9/2013 |

OTHER PUBLICATIONS

Chinese Office Action dated Feb. 5, 2018 for the Chinese Patent Application No. 201580006962.0.
Korean Office Action dated Apr. 25, 2018 for the Korean Patent Application No. 10-2016-7024712.
The Japanese Office Action dated Nov. 29, 2017 for the Japanese Application No. 2016-508803.

* cited by examiner

SUBSTRATE PROCESSING APPARATUS INCLUDING HEATING AND COOLING DEVICE, AND CEILING PART INCLUDED IN THE SAME

CROSS-REFERENCE TO RELATED APPLICATION(S)

This application is a Continuation Application of PCT International Application No. PCT/JP2015/058303, filed Mar. 19, 2015, which claimed the benefit of Japanese Patent Application No. 2014-058323, filed on Mar. 20, 2014, the entire contents of which are incorporated herein by reference.

TECHNICAL FIELD

The present disclosure relates to a substrate processing apparatus and a ceiling part.

BACKGROUND

A semiconductor manufacturing apparatus is known as an example of a substrate processing apparatus, and a vertical apparatus is known as an example of a semiconductor manufacturing apparatus.

In the vertical apparatus, processing is performed on a substrate such as a semiconductor or glass substrate under heating. For example, a substrate is accommodated within a vertical reaction tube and heated, while supplying a reaction gas, to vapor-grow a thin film on the substrate. In this type of semiconductor manufacturing apparatus, it is required that a heating part, which is a heating/cooling device, is cooled to discharge heat to the outside of a main body of the apparatus.

Conventionally, a substrate processing apparatus, including a cylindrical insulator, a heating part configured as a heating line disposed on an inner peripheral surface of the corresponding insulator, an insulating part installed so as to form a cylindrical space with respect to the corresponding heating part, a cooling gas introduction part installed above the insulating part so as to surround the heating part and connected to the cylindrical space, and a cooling gas discharge part installed at substantially the same height as that of the cooling gas introduction part in a diameter direction from a substantially central portion of the cooling gas introduction part, has been known.

In the above-mentioned substrate processing apparatus, however, a convection current occurs within a buffer area or a flow channel when the temperature is stable, having a tendency that an in-plane temperature of a substrate of a rear side of the apparatus close to an intake part is decreased, and the substrate is locally cooled, making it difficult to maintain the uniformity of the in-plane temperature of the substrate.

SUMMARY

The present disclosure provides some embodiments of a technique capable of rapidly lowering an internal temperature of a furnace, while enhancing the in-plane temperature uniformity of a substrate.

According to one embodiment of the present disclosure, there is provided a substrate processing apparatus, including: a reaction tube configured to process a substrate; a heating part disposed on an outside of the reaction tube and configured to heat the interior of the reaction tube; an insulating part disposed on an outside of the heating part; a plurality of flow channels installed in the insulating part and configured to allow an air or a cooling medium to flow; and a ceiling part configured to cover an upper surface of the insulating part, wherein the ceiling part includes a first member having a supply hole formed to communicate with the flow channels and to supply the air or cooling medium into the flow channels, and a second member disposed on the first member, having a space formed between the second member and the first member and allowing the air or the cooling medium to flow therein, and having a partition part formed to partition the space into at least two spaces.

BRIEF DESCRIPTION OF THE DRAWINGS

FIG. 3A is a front view of the intake mechanism, FIG. 3B is a side view thereof, and FIG. 3C is a bottom view thereof.

FIG. 4A is a perspective view illustrating an upper plate 60 of the ceiling part 28, FIG. 4B is a perspective view illustrating a middle plate 56, FIG. 4C is a perspective view illustrating a partition plate 58, and FIG. 4D is a perspective view illustrating a lower plate 54.

FIG. 9A is a perspective view and FIG. 9B is a top view.

FIG. 10A is a front view of the intake mechanism and FIG. 10B is a side view thereof.

FIG. 12A is a perspective view of the peripheral ceiling part 280 and FIG. 12B is a front view thereof, illustrating the flow of a cooling medium.

DETAILED DESCRIPTION

A substrate processing apparatus 10 according to an embodiment of the present disclosure will now be described with reference to the drawings.

In an embodiment to which the present disclosure is applied, the substrate processing apparatus is configured as, for example, a semiconductor manufacturing apparatus for performing substrate processing in manufacturing a semiconductor device (IC or the like). Also, in the following description, a case where a vertical apparatus (hereinafter, simply referred to as "a processing apparatus") for performing oxidation, diffusion, CVD processing, and the like on a substrate is used as the substrate processing apparatus will be described.

Figure 1:
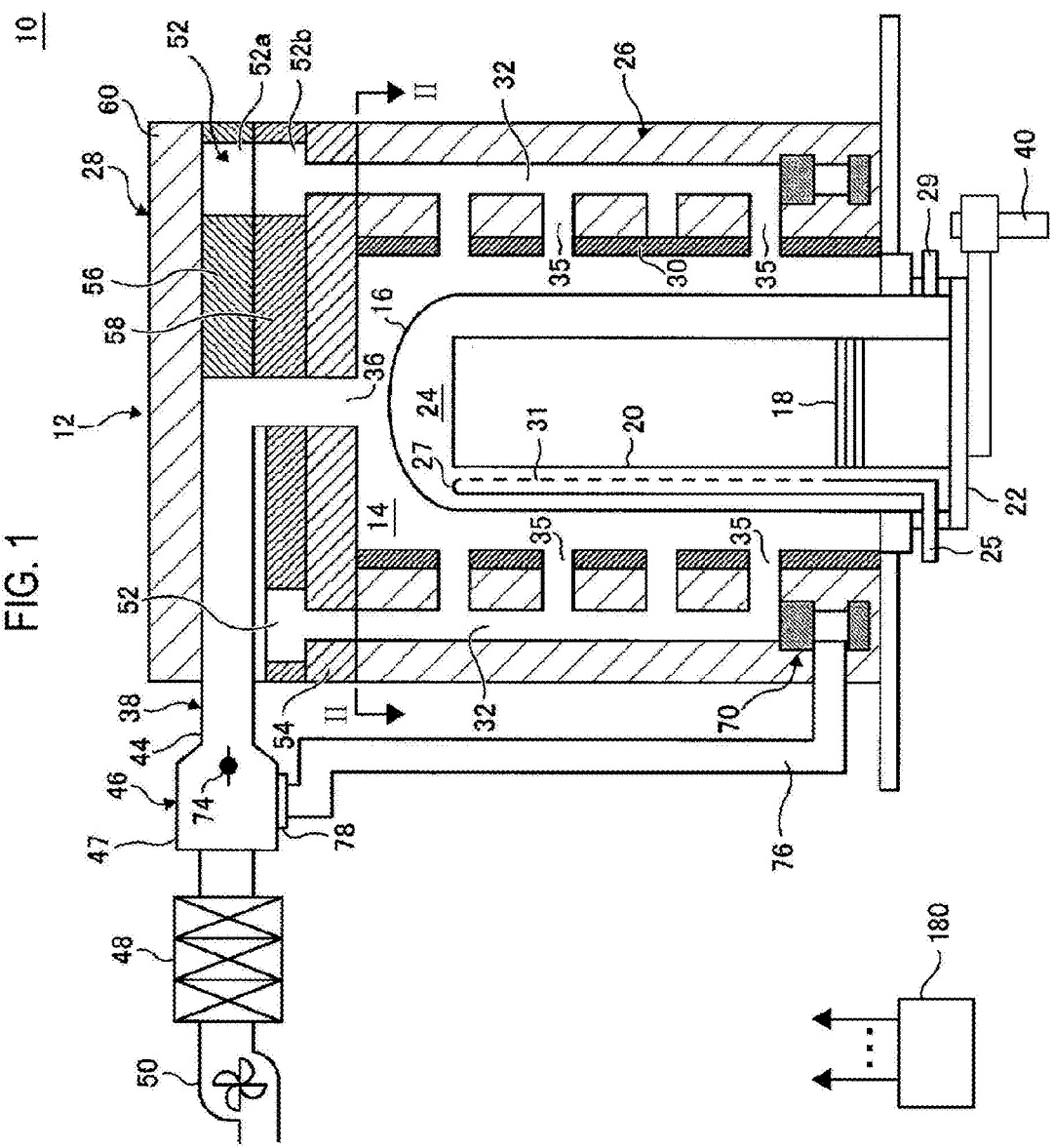
FIG. 1 is a longitudinal cross-sectional view illustrating a substrate processing apparatus 10 appropriately used according to an embodiment of the present disclosure.

As illustrated in FIG. 1, the substrate processing apparatus 10 according to this embodiment includes a housing 11 (not shown in FIG. 1), a cylindrical reaction tube 16 forming a process chamber 24, a heating part (i.e., heater) 30 configured as a resistance heater serving as a heating part installed on an outside of the reaction tube 16 to heat the interior of the reaction tube 16, a space 14 between the heating part 30 and the reaction tube 16, and a boat 20 as a substrate support for supporting a substrate (i.e., wafer) 18 to be processed within the reaction tube 16. The boat 20 is configured to support a plurality of substrates 18 within the reaction tube 16, with the substrates horizontally stacked in multiple stages with a gap therebetween. The boat 20 is loaded on an elevator 40 through a seal cap 22 and moved up and down by the elevator 40. Thus, loading the substrate 18 into the reaction tube 16 and unloading the substrate 18 from the reaction tube 16 are performed by the operation of the elevator 40. Also, the reaction tube 16 forms the process chamber 24 to accommodate and process the substrate 18.

A gas introduction pipe 25 communicates with the reaction tube 16, and a reaction gas supply source (not shown) and an inert gas supply source (not shown) are connected to the gas introduction pipe 25. In addition, a gas nozzle 27 in which a plurality of gas supply holes 31, through which a reaction gas and an inert gas are supplied into the process chamber 24, are formed is connected to the gas introduction pipe 25. Further, a gas exhaust pipe 29 is connected to a lower end portion of the reaction tube 16 to exhaust the interior of the process chamber 24.

A hollow insulating part 26 as a cooling mechanism for cooling the reaction tube 16 and the heating part 30 is disposed on an outside of the heating part 30. The insulating part 26 is for example an insulating structure in which a plurality of insulators is stacked. An upper surface of the insulating part 26 is covered by the ceiling part 28. Here, it may be considered that the ceiling part 28 is included in a cooling mechanism. It may also be considered that a heating/cooling device 12 for heating and cooling the reaction tube 16 is configured by the heating part 30, the insulating part 26, and the ceiling part 28.

Figure 2:
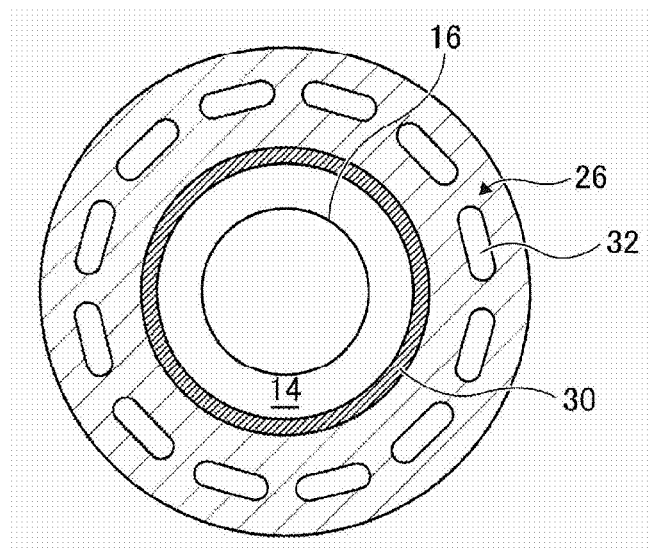
FIG. 2 is a cross-sectional view of the substrate processing apparatus 10 illustrated in FIG. 1, taken along line II-II.

A flow channel 32 as a flow channel within the insulating part, which extends substantially in a vertical direction to surround the space 14 and through which an air (ambient air) or a cooling medium flows, is formed in the insulating part 26. As the cooling medium, for example, an inert gas may be used. As illustrated in FIG. 2, the flow channel 32 may have a horizontally long shape when viewed from a plane view, and a plurality of flow channels 32 are equally formed in a circumferential direction.

In addition, a plurality of squirt holes 35 are formed in a required distribution in the flow channel 32, and as illustrated in FIG. 1, the flow channel 32 and the space 14 communicate with each other substantially horizontally. That is, it is configured such that an ambient air or cooling medium is squirted through the squirt holes 35 from the flow channel 32 to the space 14. Also, the squirt holes 35 are formed in a horizontal direction in FIG. 1, but the present disclosure is not limited thereto. For example, the squirt holes 35 may be sloped upwards to face an exhaust port 36 which will be described later.

Figure 9A:
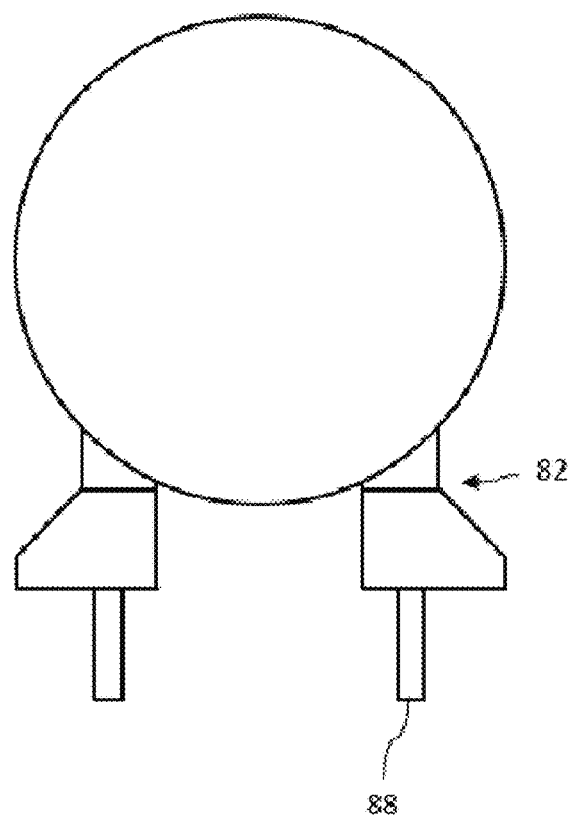
FIGS. 9A and 9B are views illustrating a state where the intake mechanism 82 illustrated in FIGS. 3A to 3C is installed on the ceiling part 28, where
Figure 9B:
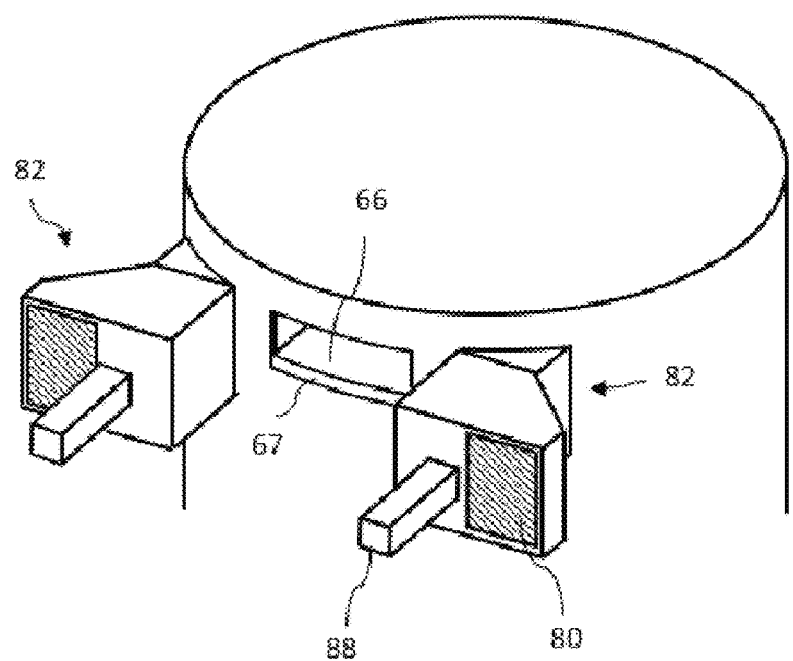

An exhaust part 38 for discharging an internal atmosphere of the space 14 to the outside of the apparatus is installed on a side surface of the ceiling part 28. The exhaust part 38 communicates with the exhaust port 36 formed substantially at the center of the ceiling part 28 through an exhaust path 66. Further, as illustrated in FIGS. 9A to 9C, the intake mechanism 82 (see FIGS. 3A to 3C) for intaking an ambient air or a cooling medium to the space 14 through the ceiling part 28 and the flow channel 32 is installed on the left and right with the exhaust part 38 interposed therebetween at substantially the same height as that of the exhaust part 38. That is, a pair of intake mechanisms 82 is installed with the exhaust part 38 interposed therebetween. The intake mechanisms 82 are installed to communicate with a buffer area 52 described later. Here, in FIGS. 9A to 9C, a state where a panel for covering the ceiling part 28 and the insulating part 26 is installed is illustrated.

The exhaust part 38 includes an exhaust pipe 44 connected to the exhaust port 36 in a communicating manner, a damper 46 as a switching part connected to the exhaust pipe 44 and an exhaust pipe 76 described later to switch the exhaust path, a radiator 48 as a heat dissipation device, and an exhaust fan 50 as an adjusting part for adjusting an exhaust flow rate of an ambient air or a cooling medium. A heated atmosphere within the space 14 is discharged to the outside of the apparatus through the exhaust pipe 44, the damper 46, the radiator 48, and the exhaust fan 50. The exhaust part 38 is formed on the rear side of the apparatus.

Figure 3A:
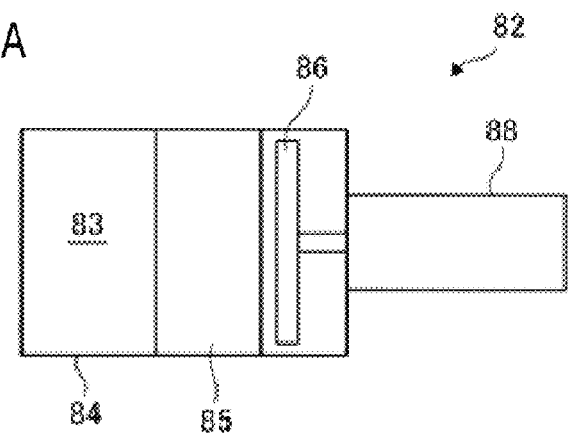
FIGS. 3A to 3C are views illustrating an intake mechanism 82 used in the substrate processing apparatus 10 appropriately used according to an embodiment of the present disclosure, where
Figure 3B:
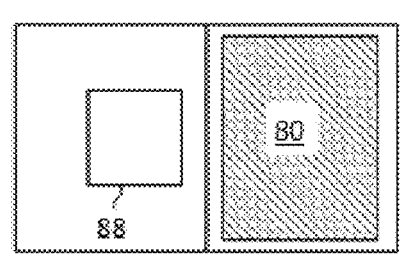
Figure 3C:
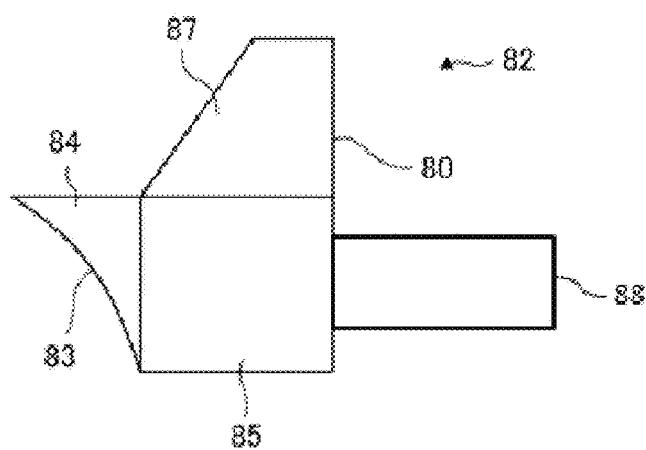
Figure 4A:
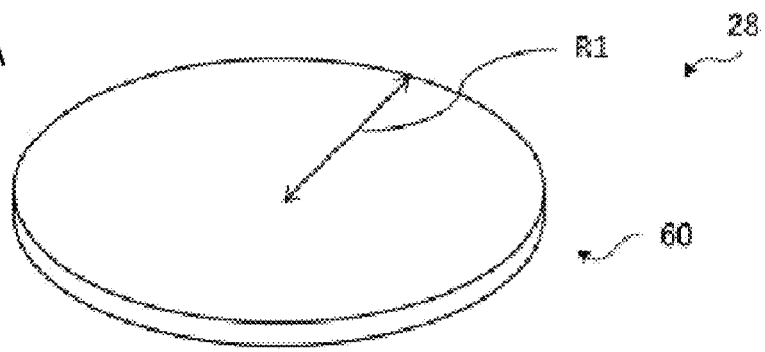
FIGS. 4A to 4D are views illustrating a ceiling part 28 appropriately used according to an embodiment of the present disclosure, where
Figure 4B:
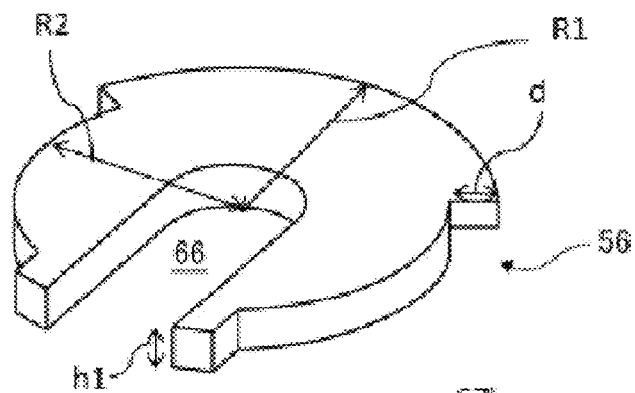
Figure 4C:
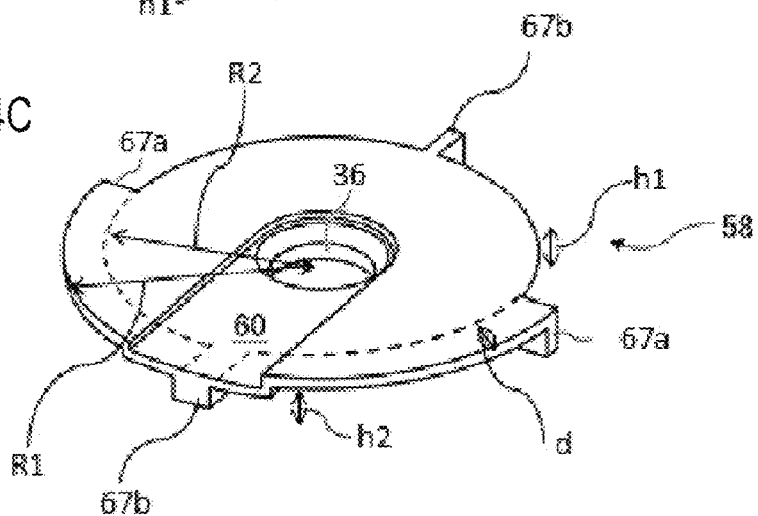
Figure 4D:
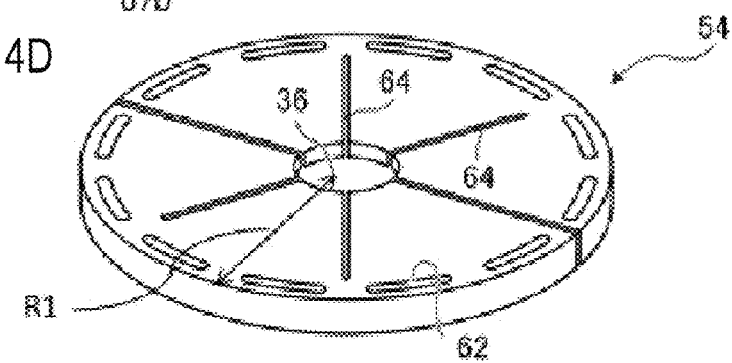
Figure 7:
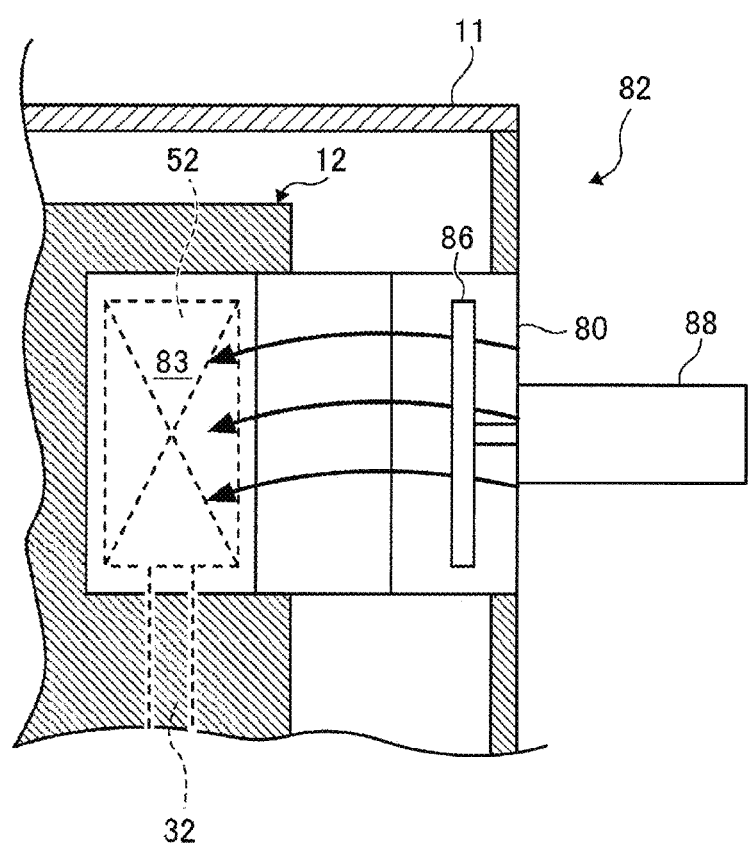
FIG. 7 is a view illustrating an air flow within the intake mechanism 82 illustrated in FIGS. 3A to 3C.

As illustrated in FIGS. 3A to 3C, the intake mechanism 82 has an intake part 84 having an intake port 83 connected to the buffer area 52, an introduction part 85 for introducing an ambient air or a cooling medium to the intake part 84, and a capture part 87 having a capture port 80 for capturing an ambient air or a cooling medium. Here, the introduction part 85 is installed to face the intake part, and the capture part is disposed to face the intake part and to be adjacent to the introduction part 85. That is, as illustrated in FIG. 3C, the introduction part 85 is disposed to be adjacent to the intake part 84 and the capture part 87 and to have an L shape in their disposition relation when viewed from a plan view. The intake part 84, the introduction part 85, and the capture part 87 are installed at substantially the same height. Also, as illustrated in FIG. 7, the intake part 84, the introduction part 85, and the capture part 87 are positioned within the housing 11, and a surface (rear surface) on which the capture port 80 of the capture part 87 and a cylinder 88 (to be described later) of the introduction part 85 are connected is exposed from the housing. That is, the intake part 84 is installed to be inserted or put into the opened portion of the housing.

As illustrated in FIG. 3C, the intake part 84 has a curved shape intake port 83 having the same curvature as that of a side surface of the ceiling part 28, and the intake port 83 is connected to the buffer area 52. That is, the intake port 83 has a shape in which the sloped portion of a triangle is formed in a curved line having a predetermined curvature when viewed from a plane view. Further, one end of the connection portion of the intake part 84 and the introduction part 85 is configured to be connected to the intake port 83.

As illustrated in FIGS. 3A and 3C, an opening/closing part 86 for blocking the intake part 84, the introduction part 85, or the capture part 87 and the cylinder 88 as a driving part for driving the opening/closing part 86 are installed on the side facing the intake port 83 within the introduction part 85. An opening/closing mechanism is configured by the opening/closing part 86 and the cylinder 88. When the cylinder 88 is moved to the intake part 84 side, the intake port 83 is closed by the opening/closing part 86 and the supply of an ambient air or a cooling medium into the ceiling part 28 is blocked. Here, the opening/closing part 86 is configured to close an interface between the intake part 84 and the introduction part 85 to form a confined space within the intake part 84, thereby closing the intake port 83. At this time, the volume of the confined space, which is the volume of the intake part 84, is smaller than that of the introduction part 85. That is, by closing the opening/closing part 86 at a position close to the ceiling part 28, it is possible to reduce the volume of the confined space of the intake part 84 when the opening/closing part 86 is closed. In this manner, since the volume of an ambient air or a cooling medium to be cooled within the confined space can be reduced by making the volume of the confined space small, it is possible to reduce a temperature difference in atmosphere between the ceiling part 28 or the insulating part 26 and the interior of the intake part 84 (confined space).

The capture part 87 is installed on a surface substantially perpendicular to an adjacent surface with the intake part 84 and the introduction part 85, and disposed in a sloped position with respect to the intake part 85. Further, the capture port 80 is installed to be substantially parallel to the adjacent surface with the intake part 84 and the introduction part 85 and at substantially the same height as that of the opening/closing part 86. Also, as illustrated in FIG. 3C, the surface of the capture part 87 facing the capture port 80 is formed to be sloped with respect to the capture port 80. That is, a cross-sectional area is gradually increased toward the intake port 83. With this configuration, an ambient air or a cooling medium introduced from the capture port 80 may not stay within the intake mechanism 82 but form a smooth flow from the capture port 80 to the intake port 83.

Figure 5:
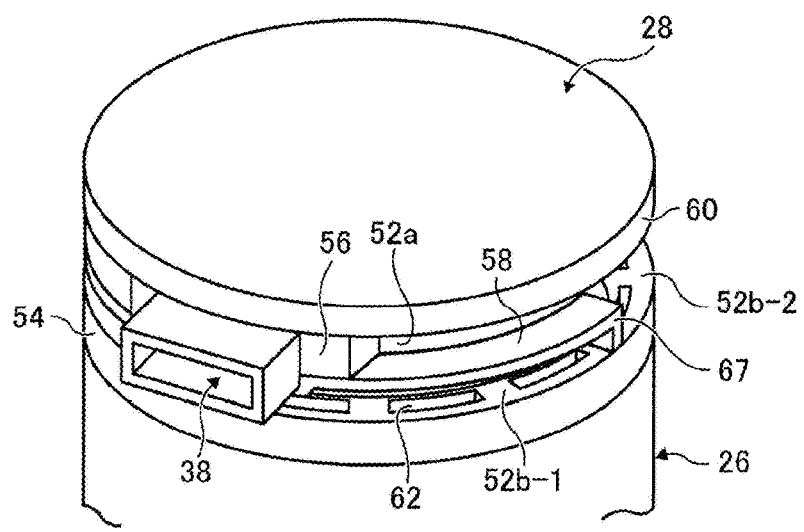
FIG. 5 is a perspective view illustrating a peripheral ceiling part 28 of the substrate processing apparatus 10 appropriately used according to an embodiment of the present disclosure.

As illustrated in FIG. 1, the buffer area 52, which is a space where an ambient air or a cooling medium flows, is formed in the ceiling part 28. The buffer area 52 communicates with an upper end of the flow channel 32 and the intake mechanism 82. The buffer area 52 is formed to be larger than a cross-sectional area of the flow channel 32 and installed so as to surround an upper portion of the heating part 30. Also, the buffer area 52 is installed to be divided into an upper space 52a and a lower space 52b. Further, as illustrated in FIG. 5, the lower space 52b is installed to be divided into a buffer area 52b-1 on the rear side of the apparatus and a buffer area 52b-2 of the front side of the apparatus.

As illustrated in FIGS. 4A to 4D, the ceiling part 28 is configured by a plurality of members (plate bodies).

The ceiling part 28 includes a lower plate 54 as a first member (first plate) forming a lower end portion of the ceiling part 28, a partition plate 58 as a second member (second plate) installed on the lower plate 54, a middle plate 56 as a third member (third plate) installed on the partition plate 58, and an upper plate 60 as a fourth member (fourth plate) installed on the middle plate 58 and forming an upper end portion of the ceiling part 28 in this order from below.

The lower plate 54 has a disk shape and the exhaust port 36 for exhausting an internal atmosphere of the space 14 to the outside of the apparatus is formed at the center thereof. In addition, a plurality of supply holes 62 for communicating with the flow channel 32 and supplying an ambient air or a cooling medium to the flow channel 32 are installed around the exhaust port 36 and communicate with the flow channel 32. A plurality of recesses 64 are installed on the lower plate 54, and damage to the lower plate 54 due to heat is prevented by the recesses 64. Instead of the recesses 64, open slits may be installed on the space 14 side. Here, the lower plate 54 may be integrally formed or may be installed to be divided into two or more sections.

The middle plate 56 communicates with the exhaust port 36 substantially vertically, and has the exhaust path 66 penetrated substantially horizontally (in a diameter direction) toward a connection portion with the exhaust pipe 44. Further, the middle plate 56 has a disk shape having a portion (large diameter portion) of a radius R1 and a portion (small diameter portion) of a radius R2 smaller than the radius R1. The small diameter portion is formed by ones on the left and right symmetrically with respect to a central line of the exhaust path 66 when viewed from a plan view. With this configuration, the upper space 52a as a space having a height h1 equal to the thickness of the middle plate 56 is formed around the small diameter portion of the middle plate 56.

The upper plate 60 has a disk shape having the radius R1.

The partition plate 58 is installed between the lower plate 54 and the middle plate 56. The partition plate 58 has a disk shape having a portion (large diameter portion) of a radius R1 and a portion (small diameter portion) of a radius R2 smaller than the radius R1 and has a shape having a recess having a width d (R1-R2) and a partition portion 67 along an outside of a lower surface of the large diameter portion.

An exhaust port 36 is formed at the center of the partition plate 58. Further, a recess 60 having a shape corresponding to the exhaust path 66 is formed on an upper surface of the partition plate 58 and forms a lower surface of the exhaust path 66.

With this configuration, the buffer area 52b-2, which is a space of a height h1 equal to a thickness of the partition plate 58, is formed around the small diameter portion of the partition plate 58, and the buffer area 52b-1, which is a space of a height h2 lower than the height h1, is formed below the large diameter portion.

The partition portion 67 includes a partition section 67a formed on a lower surface of a boundary portion between the large diameter portion and the small diameter portion and a partition section 67b formed on the lower surface along a central line of the recess 60 when viewed from a plan view. The lower space 52b is divided into the buffer area 52b-1 of the rear side and the buffer area 52b-2 of the front side by the partition portion 67a. Also, the buffer area 52 is divided into the left and right by the partition portion 67b and an ambient air or a cooling medium is supplied from the pair of intake mechanisms 82 to each of the buffer areas 52.

The smaller diameter portion of the partition plate 58 and the small diameter portion of the middle plate 56 are formed to overlap at least a portion. With this configuration, the buffer area 52a and the buffer area 52b-2 may communicate with each other and an ambient air or a cooling medium may be supplied from the intake mechanism 82 to the buffer area 52b-2.

As illustrated in FIG. 5, the flow channel 32 on the rear side (exhaust part 38 side) communicates with the buffer area 52b-1, and the flow channel 32 on the front side (the side facing the exhaust part 38) communicates with the buffer area 52b-2.

As described above, the height h1 of the buffer area 52a and the buffer area 52b-2 is higher than the height h2 of the buffer area 52b-1. With this configuration, it is possible to adjust a supply balance of an ambient air or a cooling medium to the buffer area 52a and the buffer area 52b-2. That is, by setting the height h1 of the buffer area 52a and the buffer area 52b-2 to be higher than the height h2 of the buffer area 52b-1, it is also possible to supply a sufficient amount of ambient air or cooling medium to the flow channel 32 on the front side distant from the intake port 83.

Figure 6:
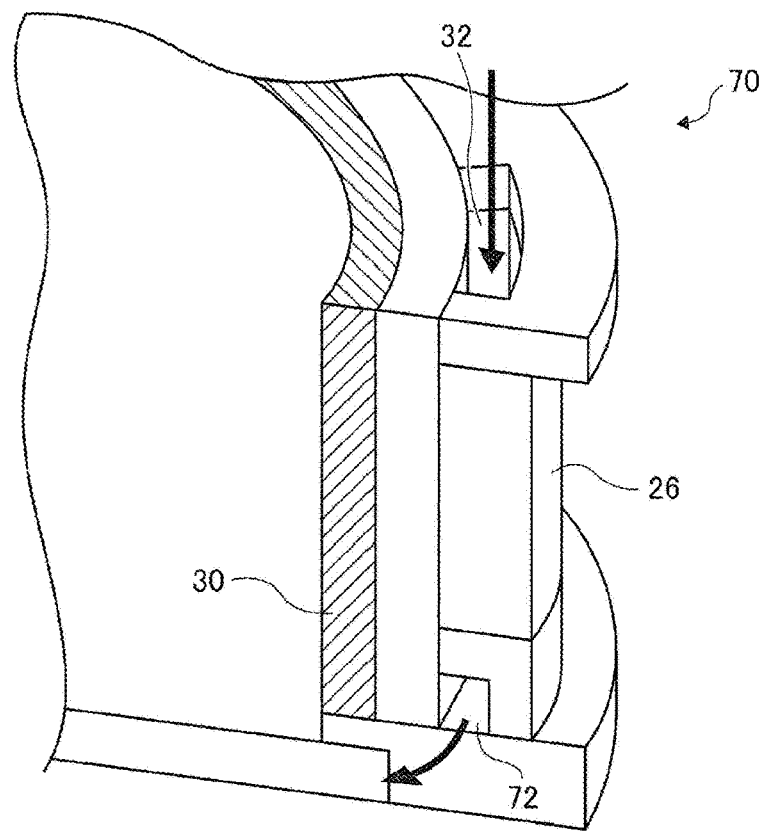
FIG. 6 is a view illustrating a peripheral lower end portion 70 of the substrate processing apparatus 10 appropriately used according to an embodiment of the present disclosure.

As illustrated in FIG. 6, the flow channel 32 substantially vertically formed within the insulating part 26 communicates with a flow channel 72 as a lower flow channel formed in a circumferential direction from the lowermost end portion of the flow channel 32. The flow channel 72 is formed to have a concentric circle shape on an outside of the heating part 30.

Further, as illustrated in FIG. 1, the exhaust pipe 44 is substantially horizontally connected to the damper 46, and the damper 46 has a damper case 47 having a width larger than the exhaust pipe 44. A lower end portion 70 of the flow channel 32 and a lower surface of the damper case 47 are connected to the exhaust pipe 76. A chucky valve (not shown) is installed in a connection portion of the lower end portion 70 with the exhaust pipe 76, and only when an ambient air or a cooling medium flows from the lower end portion 70 to the exhaust pipe 76, the chucky valve releases to form a flow channel. A plate 78 having a hole formed at the center and allowing the exhaust pipe 76 to be connected thereto is installed in a connection portion of the damper case 67 with the exhaust pipe 76. Here, in FIG. 1, it is illustrated that the exhaust pipe 76 is installed on an outer side of the insulating part 26 to help understand the configuration.

A switching part 74 is installed in a flow channel exhausted from the exhaust pipe 44 in an interior of the damper case 47, and an exhaust flow rate from the exhaust pipe 44 may be adjusted or an exhaust path may be switched by the operation of the switching part 74. In this embodiment, the exhaust flow rate is adjusted by controlling revolution per minute (RPM) of the exhaust fan 50, but may also be adjusted by adjusting a switching angle of the switching part 74.

A control part 180 has an operation part (not shown) or an input/output part (not shown), is electrically connected to each component of the substrate processing apparatus 10, and controls each component of the substrate processing apparatus 10. The control part 180 commands temperature control, pressure control, flow rate control, and machine driving control based on a recipe in which a control sequence of a process such as film formation is indicated on a time axis.

Next, a method for forming a thin film on a substrate, which is one of the manufacturing processes of a semiconductor device, using the aforementioned substrate processing apparatus will be described. In the following description, an operation of each part forming the substrate processing apparatus is controlled by a controller 121.

First, the boat 20 that supports the substrate 18 is loaded into the reaction tube 16 by operating the elevator 40. Subsequently, the heating part 30 is heated to heat the reaction tube 16, a reaction gas is introduced into the reaction tube 16 through the gas introduction pipe 25, and the interior of the reaction tube 16 is exhausted through the gas exhaust pipe 29, to thereby form a thin film on the surface of the substrate 18.

When the formation of the thin film (film forming process) is completed, the heating by the heating part 30 is stopped in a state where the exhaust from the gas introduction pipe 25 is continued, and the heated atmosphere within the reaction tube 16 is externally discharged to lower an internal temperature of the reaction tube 16. At this time, an inert gas may be introduced from the gas introduction pipe 25.

After the internal temperature of the reaction tube 16 is lowered to a predetermined temperature, the elevator 40 is operated to draw the boat 20 out from the reaction tube 16, and the substrate 18 on which the film is formed is extracted from the reaction tube 16.

Further, as described below, an ambient air or a cooling medium is introduced into the insulating part 26, thereby cooling the reaction tube 16, the interior of the reaction tube 16, or the heating part 30.

As illustrated in FIG. 7, in the intake mechanism 82, the capture port 80 is installed at substantially the same height as that of the buffer area 52, and when the opening/closing part 86 is moved in a direction opposite to the buffer area 52 side by the operation of the cylinder 88, an ambient air or a cooling medium linearly flows from the capture port 80 to the intake port 83 so as to be drawn toward the buffer area 52. Accordingly, the ambient air or cooling medium also sufficiently flows to the flow channel 32 near the entrance, improving an overall air flow balance.

The ambient air or cooling medium drawn from the intake mechanism 82 flows to the buffer area 52 of the ceiling part 28. Here, the partition plate 58 installed to be substantially horizontal to the upper plate 60 partitions the buffer area 52 into the upper space 52a and the lower space 52b, and substantially vertically partitions the lower space 52b on a rear side and on a front side. Thus, a supply flow channel of the ambient air or cooling medium supplied into the buffer area 52 may be independently divided into a supply flow channel in which the ambient air or cooling medium flows to the flow channel 32 on the rear side and a supply flow channel in which the ambient air or cooling medium flows to the flow channel 32 on the front side. That is, in the ambient air or cooling medium introduced separately to the upper space 52a and the lower space 52b, the ambient air or cooling medium flowing to the lower space 52b flows through the flow channel 32 communicating with the buffer area 52b-1 on the rear side, and the ambient air or cooling medium flowing to the upper space 52a is introduced to the buffer area 52b-2 through the upper space 52a and flows to the flow channel 32 communicating with the buffer area 52b-2 on the front side.

Figure 8A:
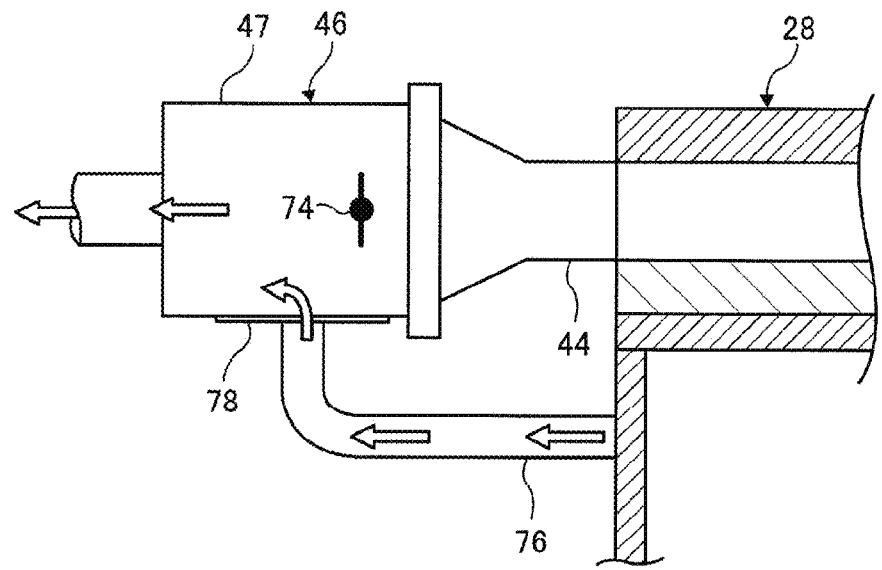
FIGS. 8A and 8B are a view illustrating the operation of a damper 46 used in the substrate processing apparatus 10 appropriately used according to an embodiment of the present disclosure.

The ambient air or cooling medium introduced to the flow channel 32 cools the heating part 30 or the reaction tube 16 and is exhausted through the exhaust port 36 or the exhaust pipe 76. In the case of cooling a sidewall (insulating part 26), as illustrated in FIG. 8A, the switching part 74 of the damper 46 is closed and the chucky valve of the lower end portion 70 is opened, and the ambient air or cooling medium taken in from the intake mechanism 82 flows to the flow channel 32 on the rear side and the front side through the buffer areas 52b-1 and 52b-2 formed in the ceiling part 28 and is exhausted to the outside of the apparatus through the flow channel 72, the exhaust pipe 76, and the interior of the damper case 47 formed in a circumferential direction from the lowermost end portion of the flow channel 32. Accordingly, the insulating part 26 can be intensively cooled.

Figure 8B:
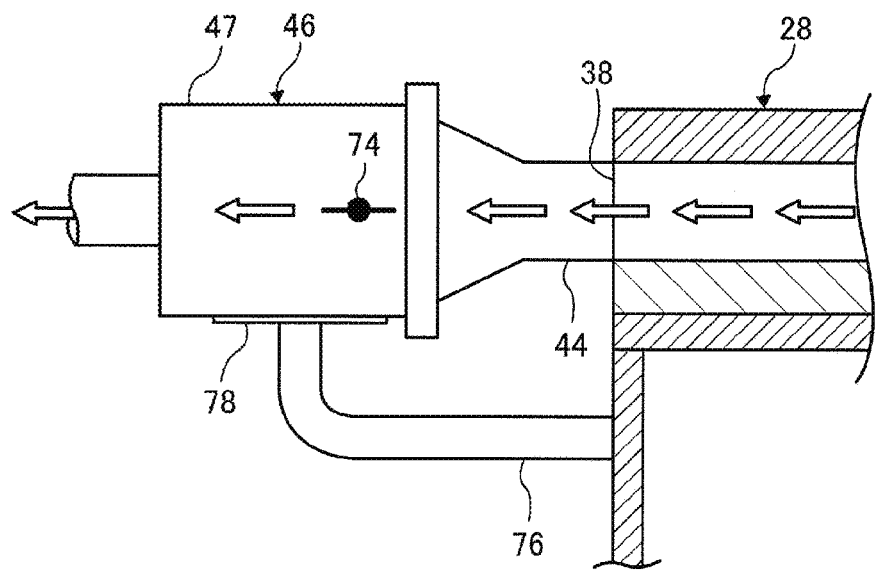

In the case of rapid cooling to intensively cool the heating part 30 or the reaction tube 16, as illustrated in FIG. 8B, the switching part 74 of the damper 46 is opened and the ambient air or cooling medium intaken from the intake mechanism 82 flows to the flow channel 32 on the rear side and the front side through the buffer areas 52b-1 and 52b-2 formed in the ceiling part 28, is supplied into the space 14 through the squirt holes 35, and exhausted outside of the apparatus through the exhaust port 36, the exhaust pipe 44, and the interior of the damper case 47. Accordingly, the heating part 30 or the reaction tube 16 can be intensively cooled.

In this manner, by introducing the ambient air or cooling medium into the insulating part 26, it is possible to lower an internal temperature of the reaction tube 16. At this time, by appropriately switching the switching part 74 of the damper 46, it becomes possible to switch sidewall cooling and rapid cooling.

Next, an intake mechanism 90 according to another embodiment of the present disclosure will be described.

Figure 10A:
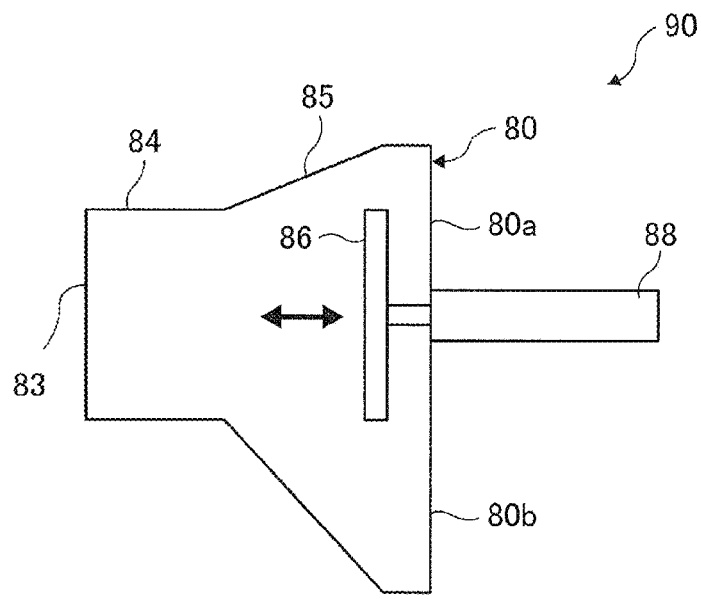
FIGS. 10A and 10B are views illustrating an intake mechanism 90 used in a substrate processing apparatus 10 according to another embodiment of the present disclosure, where
Figure 10B:
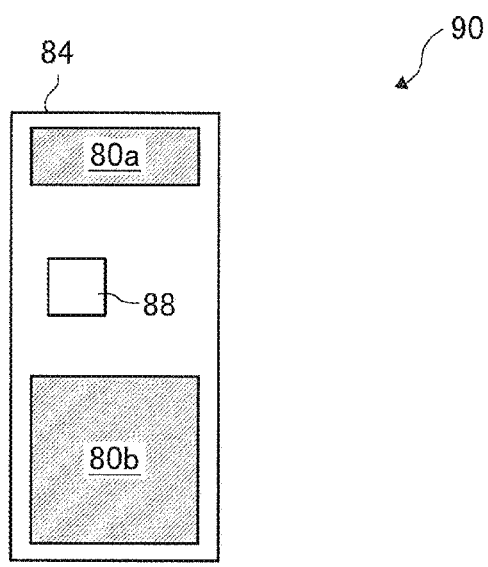

As illustrated in FIGS. 10A and 10B, the intake mechanism 90 has the intake part 84 having the intake port 83 connected to the buffer area 52 and the introduction part 85 for introducing an ambient air or a cooling medium toward the intake part 84.

As illustrated in FIG. 10A, the intake part 84 has the intake port 83, and the intake port 83 is connected to the buffer area 52. The introduction part 85 has a shape widened outwardly in a vertical direction from an adjacent surface with the intake part 84, and an opening/closing part 86 operating in the cylinder 88 is installed on the side facing the intake port 83 side within the introduction part 85. Also, the capture port 80 for introducing an ambient air or a cooling medium to the space 14 is installed above and below the opening/closing part 86. That is, the intake mechanism 90 has a shape in which a flow channel is narrowed from the capture port 80 of the introduction part 85 toward the intake port 83.

As illustrated in FIG. 10B, the capture port 80 has a capture port 80a installed above the cylinder 88 and a capture port 80b installed below the cylinder 88. The sum of introduction holes with the capture port 80a and the capture port 80b is greater than the area of the intake port 83. With this configuration, the ambient air introduced to the space 14 linearly flows and the in-plane temperature uniformity of the substrate can be enhanced in the case of rapid cooling.

Figure 11:
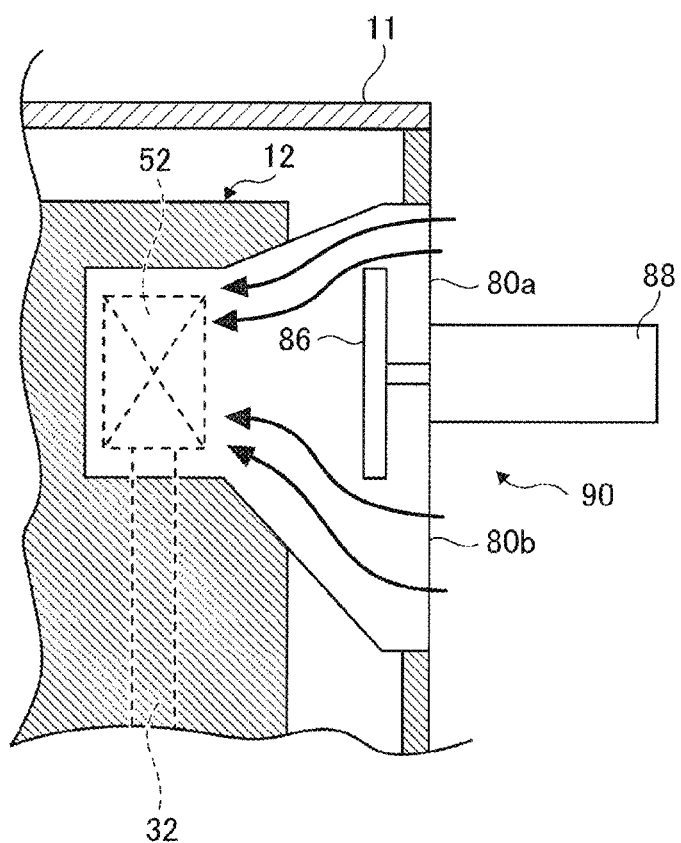
FIG. 11 is a view illustrating an air flow within the intake mechanism 90 illustrated in FIGS. 10A and 10B.

As illustrated in FIG. 11, the ambient air or cooling medium is drawn toward the buffer area 52 linearly from a vertical direction of the capture ports 80a and 80b, i.e., the intake mechanism 90. Accordingly, the ambient air also sufficiently flows to the flow channel 32 near the entrance, improving an overall air flow balance.

Figure 12A:
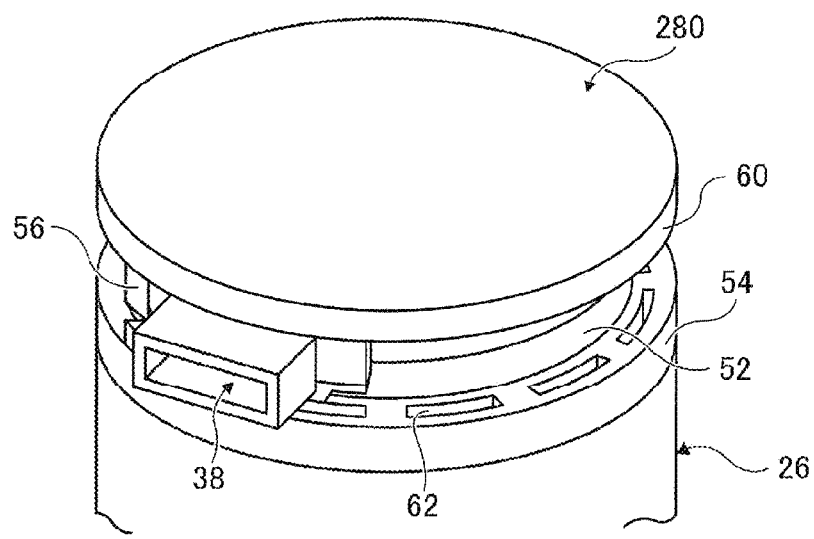
FIGS. 12A and 12B are views illustrating a peripheral ceiling part 280 according to a comparative example of the present disclosure, where
Figure 12B:
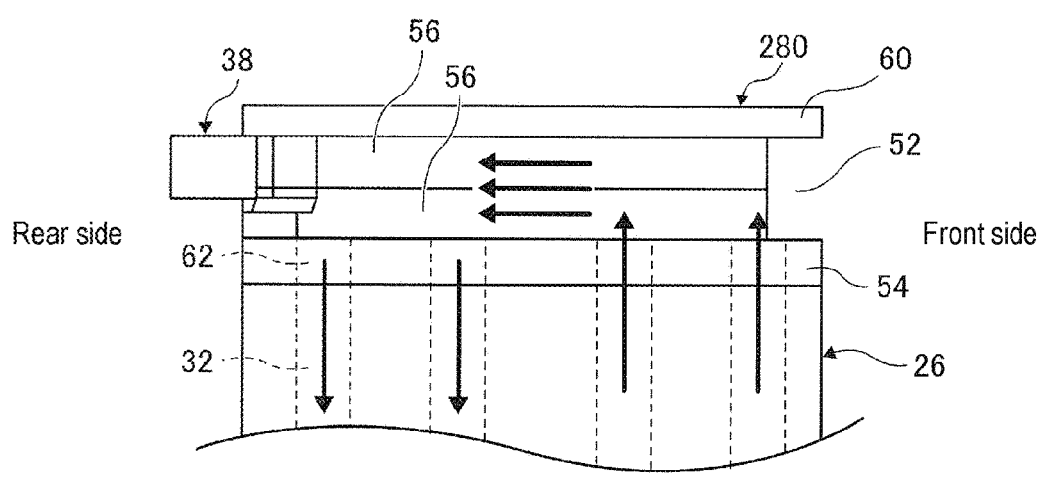

FIGS. 12A and 12B are a view illustrating a peripheral ceiling part 280 of a substrate processing apparatus according to a comparative example.

In the substrate processing apparatus according to the comparative example, the partition plate 58 for partitioning the buffer area 52 of the ceiling part 280 to the rear side and the front side is not present, and the upper end portion of the flow channel 32 communicates with the buffer area 52 common on the rear side and the front side. That is, the flow channel 32 on the rear side and the flow channel 32 on the front side communicate with each other within the buffer area 52.

Figure 13:
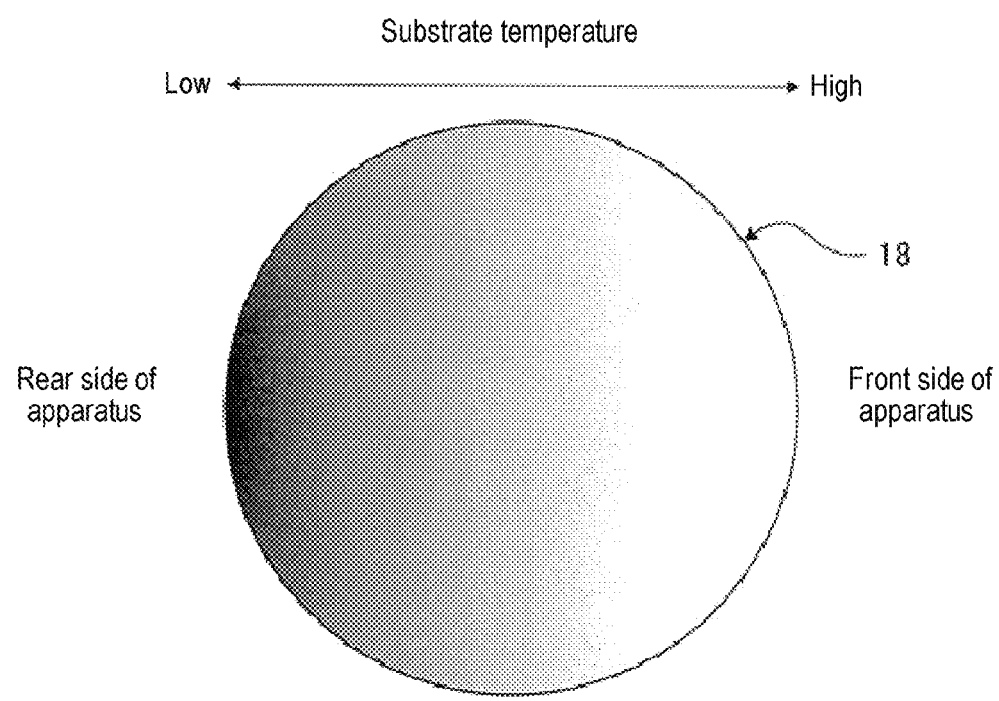
FIG. 13 is a view illustrating a temperature distribution of a substrate in case of cooling using the ceiling part 280 according to the comparative example.

Accordingly, when there is a temperature difference in the front side and the rear side of the insulating part 26, a descending air current that a cooled atmosphere flows downwardly is generated on the rear side and an ascending air current that a warm atmosphere flows upwardly is generated on the front side. As in the comparative example, in a case where the flow channel 32 on the rear side and the flow channel 32 on the front side communicate with each other within the buffer area 52, as indicated by the arrows in FIG. 12B, a cycle (convection current) is generated due to the descending air current and the ascending air current within the buffer area 52 and the flow channel 32. As a result, as illustrated in FIG. 13, the cooling states on the rear side and on the front side are different, affecting the in-plane temperature uniformity of the substrate on the rear side and on the front side.

A temperature difference in the ceiling plate 280, the insulating part 26, the heating part 30, or the reaction tube 16 is generated due to positions where such components are disposed or positions of the flow channels of the ambient air or cooling medium. That is, since such components are easily radiated by a degree by which such components are close to the outside of the housing, in other words, a degree by which such components are close to an ambient air, they can be easily cooled. Further, since a fresh air or cooling medium is easily introduced by a degree of the flow channel 32 close to the intake mechanism for supplying the ambient air or cooling medium, the components are considered to be easily cooled compared with other parts. Due to this factor, a temperature difference may occur and a convection current may be generated. At this time, by blocking a portion in which the descending air current and the ascending air current generated due to the temperature difference communicate with each other, from the partition plate 58, that is, by separating the descending air current and the ascending air current from the partition plate 58, it is possible to suppress the generation of a convection current within the ceiling plate 280 and the insulating part 26, improving the in-plane temperature uniformity of the substrate.

In this embodiment, one or more effects set forth below are obtained.

(1) According to this embodiment, since the occurrence of a temperature difference on the rear side and the front side of the apparatus can be suppressed, a temperature recovery time can be shortened, improving the productivity. In addition, the recipe time can be shortened and power consumption can be reduced at the time of stabilization to reduce energy consumption, realizing energy saving. Further, since the temperature uniformity between the in-plane of the substrate 18 and the substrate 18 is improved, the product yield is reduced.

(2) The capture port 80 of the intake mechanism connected to the buffer area 52 of the ceiling part 28 has a capture port 80a installed above the cylinder 88 and a capture port 80b installed below the cylinder 88. The sum of the areas of the introduction holes with the capture port 80a and the capture port 80b is greater than the area of the buffer area 52. Thus, the ambient air introduced to the space 14 linearly flows and the in-plane temperature uniformity of the substrate at the time of rapid cooling can be enhanced.

(3) The opening/closing part 86 of the intake mechanism 82 is closed in a position close to the ceiling part 28. Thus, the volume of the space confined within the intake part when the opening/closing part 86 is closed can be reduced. That is, the opening/closing part 86 is installed in a portion close to the ceiling part 28 and the volume of the confined space is reduced, and thus, the atmosphere of the corresponding confined space can be set to a temperature or an environment close to the atmosphere of the buffer area 52 or the flow channel 32. The generation of cooled air within a confined space, compared with the atmosphere of the buffer area 52 and the flow channel 32 can be prevented and the generation of convection of air due to a temperature difference within the ceiling part 28 can be suppressed. Thus, the in-plane temperature uniformity of the substrate 18 can be improved.

(4) The entrance of the flow channel 32 communicating with the space 14 is divided into a rear side and a front side of the apparatus. Thus, in the buffer area 52 of the entrance of the flow channel 32, even though a temperature difference occurs between the front side and the rear side and an ascending air current of an ambient air or a cooling medium is generated in the flow channel 32 on the front side and a descending air current of an ambient air or as cooling medium is generated in the flow channel 32 on the rear side because the flow channel 32 on the rear side of the apparatus and the flow channel 32 on the front side of the apparatus are not connected, since the flow channel 32 on the apparatus side and the front channel 32 on the front side are partitioned, a flow cycle of the ascending air current and the descending air current causing a convection current can be suppressed and the in-plane temperature uniformity of the substrate 18 can be improved. Since the in-plane temperature uniformity of the substrate 18 can be improved, the uniformity of a film thickness and the film quality of film formation can also be improved.

(5) By appropriately switching the switching part 74 of the damper 46, it is possible to exhaust in two directions with respect to the damper 46. That is, by installing a route for exhausting without passing through the space 14, it is possible to quickly lower the temperature of the sidewall (insulating part), and to cool the sidewall of the heating part 30 depending on circumstances, to accelerate the radiation from the heating part 30. In addition, as necessary, it is possible to lower an internal temperature of a furnace or to suppress the function of the insulating part to shorten a temperature convergence time.

(6) Based on the spaces near the ceiling part 28, it is possible to use an embodiment of a vertical or horizontal intake mechanism and to miniaturize the apparatus.

(7) Since the interior of the furnace is uniformly or effectively cooled and the temperature of the reaction tube 16 is quickly lowered and the temperature of the substrate 18 is quickly lowered to a predetermined temperature for extracting from the reaction tube, the throughput can be enhanced. In addition, the in-plane or inter-plane uniformity of the substrate 18 can be enhanced.

Further, in the aforementioned embodiment, while the cylindrical heating/cooling device 12 is illustrated, the present disclosure is not limited thereto and may be applied to cylindrical heaters having various cross-sectional shapes. Moreover, the shape of the ceiling part 28 is also not limited to a disk shape and may be variously set depending on the sectional shape of the insulating part 26 to stop the upper opening of the insulating part 26.

The present disclosure may also be applied to not only a semiconductor manufacturing apparatus but also an apparatus for processing a glass substrate such as an LCD device.

Further, the present disclosure may be applied to a valid device using a substrate processing apparatus used in a film forming process or the like based on a reflow, annealing, and thermal CVD reaction for carrier activation or planarization after performing oxidation, spreading, or ion doping on a semiconductor wafer prepared by, for example, a semiconductor integrated circuit device (semiconductor device), regarding a semiconductor manufacturing technique, in particular, a heat treatment technique in which a substrate to be processed is accommodated in the process chamber, heated by the heating/cooling device, and processed.

<Aspects of the Present Disclosure>

Hereinafter, some aspects of the present disclosure will be additionally stated as supplementary notes.

(Supplementary Note 1)

According to one aspect of the present disclosure, there is provided a substrate processing apparatus, including:

a reaction tube configured to process a substrate;

a heating part disposed on an outside of the reaction tube and configured to heat the interior of the reaction tube;

an insulating part disposed on an outside of the heating part;

a plurality of flow channels installed in the insulating part and configured to allow an ambient air or a cooling medium to flow; and a ceiling part configured to cover an upper surface of the insulating part, wherein the ceiling part includes a first member having a supply hole formed to communicate with the flow channels and to supply the air or the cooling medium into the flow channels, and a second member disposed on the first member, having a space formed between the second member and the first member and allowing the air or the cooling medium to flow therein, and having a partition part formed to partition the space into at least two spaces.

(Supplementary Note 2)

According to another aspect of the present disclosure, there is provided a cooling mechanism, including:

a hollow insulating part in which a plurality of flow channels configured to allow an ambient air or a cooling medium to flow are installed; and a ceiling part configured to cover an upper surface of the insulating part, wherein the ceiling part includes at least a first member having a supply hole formed to communicate with the flow channels and to supply the ambient air or the cooling medium into the flow channels, and a second member disposed on the first member, having a space formed to allow the ambient air or the cooling medium to flow between the second member and the first member, and having a partition part formed to divide the space into at least two spaces.

(Supplementary Note 3)

According to another aspect of the present disclosure, there is provided a ceiling part on which a plurality of plate bodies are stacked and in which a space is formed to allow an ambient air or a cooling medium to flow therein, wherein the ceiling part includes at least a partition plate in which a partition part for dividing the space is formed below the ceiling part.

(Supplementary Note 4)

According to another aspect of the present disclosure, there is provided a substrate processing apparatus, including:

a reaction tube configured to process a substrate;

a heating part disposed on an outside of the reaction tube and configured to heat the interior of the reaction tube;

an insulating part disposed on an outside of the heating part, and in which a plurality of flow channels configured to allow an ambient air or a cooling medium to flow are formed; and a ceiling part configured to cover an upper surface of the insulating part, having a space configured to supply the ambient air or the cooling medium to the insulating part, and having an exhaust path formed to exhaust the ambient air or the cooling medium from the insulating part;

an intake mechanism connected to the space and configured to supply the ambient air or the cooling medium to the ceiling part; and an exhaust part connected to the exhaust path and configured to exhaust the ambient air or the cooling medium from the ceiling part, wherein the intake mechanism is installed on the left and right by one pair with the exhaust part interposed therebetween.

(Supplementary Note 5)

In the apparatus of Supplementary Note 4, preferably, the intake mechanism includes a capture part configured to introduce the ambient air or the cooling medium to the intake mechanism, an intake part configured to intake the ambient air or the cooling medium into the ceiling part, and an introduction part configured to allow the capture part and the intake part to communicate with each other, wherein the introduction part is disposed to be adjacent to the intake part and the capture part and to have an L shape in their disposition relation when viewed from a plan view.

(Supplementary Note 6)

In the apparatus of Supplementary Note 5, preferably, the introduction part further includes an opening/closing part configured to block the supply of the ambient air or the cooling medium to the ceiling part and a driving part configured to drive the opening/closing part, wherein the opening/closing part is configured to open and close an interface between the intake part and the introduction part.

(Supplementary Note 7)

In the apparatus of any one of Supplementary Notes 5 and 6, preferably, a volume of the introduction part is greater than that of the intake part.

(Supplementary Note 8)

In the apparatus of any one of Supplementary Notes 5 to 7, preferably, the intake part has an intake port configured to supply the ambient air or the cooling medium to the ceiling part in a connection surface with the ceiling part, and the intake port has a curved shape.

(Supplementary Note 9)

According to another aspect of the present disclosure, there is provided a method of manufacturing a semiconductor device or a method of processing a substrate, including:

heating the interior of a reaction tube by a heating part disposed on an outside of the reaction tube, and processing a substrate within the reaction tube;

covering an upper surface of an insulating part in which a plurality of flow channels disposed on an outside of the heating part and configured to allow an ambient air or a cooling medium to flow are installed, and supplying the ambient air or the cooling medium to the ceiling part having a first member configured to communicate with the flow channels and having a supply hole formed to supply the ambient air or cooling medium into the flow channels, and a second member disposed on the first member, having a space formed to allow the ambient air or the cooling medium to flow between the second member and the first member, and having a partition part formed to divide the space into at least two spaces, to allow the ambient air or the cooling medium to flow to the flow channels, to thereby cool the interior of the reaction tube.

(Supplementary Note 10)

According to another aspect of the present disclosure, there is provided a substrate processing apparatus, including:

a reaction tube configured to process a substrate;

an insulating part installed on an outside of the reaction tube; and an exhaust mechanism configured to exhaust an ambient air or a cooling medium from the interior of the insulating part, wherein the exhaust mechanism includes a damper configured to switch an exhaust flow channel, a first exhaust pipe connected to the damper and installed in a ceiling part of the insulating part, and a second exhaust pipe connected to the damper and installed in a sidewall of the insulating part, the damper being configured to switch an exhaust path through the first exhaust pipe and an exhaust path through the second exhaust pipe.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a reaction tube configured to process a substrate;
a heating part disposed on an outside of the reaction tube and configured to heat the interior of the reaction tube;
an insulating part disposed on an outside of the heating part;
a plurality of flow channels installed in the insulating part and configured to allow an air or a cooling medium to flow; and
a ceiling part configured to cover an upper surface of the insulating part,
wherein the ceiling part includes:
a first member having a plurality of supply holes formed to communicate with the flow channels and to supply the air or the cooling medium into the flow channels, the plurality of supply holes including a first group of supply holes and a second group of supply holes; and
a second member that is disposed on the first member includes a partition part that forms first and second spaces communicating with the first group of supply holes and the second group of supply holes, respectively, and allows:
a first portion of the air or the cooling medium to flow through the first space to be supplied to the first group of supply holes; and
a second portion of the air or the cooling medium to flow through the second space to be supplied to the second group of supply holes.

2. The apparatus of claim 1, further comprising at least one intake mechanism configured to supply the air or the cooling medium to first and second spaces,
wherein the intake mechanism includes:
an intake part having an intake port having a same curvature as that of a side surface of the ceiling part and configured to connect with the first and second spaces;
a capture part configured to capture the air or the cooling medium therein; and
an introduction part configured to allow the intake part and the capture part to communicate with each other.

3. The apparatus of claim 2, wherein the at least one intake mechanism comprises an opening/closing part installed in the introduction part to open and close the intake port, and a driving part configured to drive the opening/closing part.

4. The apparatus of claim 3, wherein the introduction part faces the intake part and the capture part is adjacent to the introduction part, and
wherein the intake part, the introduction part, and the capture part are installed at substantially a same height.

5. The apparatus of claim 2, wherein the second member is disk shaped having a large diameter portion and a small diameter portion, and wherein the at least one intake mechanism is disposed on a circumference of the large diameter portion of the second member.

6. The apparatus of claim 5, further comprising:
a third member disposed on the second member and having a disk shape having a large diameter portion and a small diameter portion; and
a fourth member disposed on the third member and having a disk shape formed as an upper end of the ceiling part.

7. The apparatus of claim 6, wherein the large diameter portion of the third member is located only over the small diameter portion of the second member while the small diameter portion of the second member and the small diameter portion of the third member at least partially overlap.

8. The apparatus of claim 5, wherein an exhaust port configured to exhaust the air or the cooling medium is located at the center of the first member and the second member.

9. The apparatus of claim 8, further comprising a third member disposed on the second member and having a disk shape having a large diameter portion and a small diameter portion,
wherein the third member has an exhaust path in a diameter direction to communicate perpendicularly to the exhaust port, and the exhaust path is located over the large diameter portion of the second member.

10. A ceiling part of an insulating part having a space formed to allow an air or a cooling medium to flow therein, the ceiling part comprising:

a first member having a plurality of supply holes formed to supply the air or the cooling medium to the insulating part, the plurality of supply holes including a first group of supply holes and a second group of supply holes; and
a second member that is disposed on the first member includes a partition part that forms first and second spaces communicating with the first group of supply holes and the second group of supply holes, respectively, and allows:
a first portion of the air or the cooling medium to flow through the first space to be supplied to the first group of supply holes, and
a second portion of the air or the cooling medium to flow through the second space to be supplied to the second group of supply holes.

11. The apparatus of claim 1, wherein the second member vertically separates the portion of the air or the cooling medium and the second portion of the air or the cooling medium so that the each portion flows horizontally.

12. The apparatus of claim 1, further comprising at least one intake part attached to a side surface of the ceiling part,
wherein the plurality of flow channels is formed substantially vertically, and
wherein the first group of supply holes communicate with a first part of the flow channels located closer to the at least one intake part than a second part of the flow channels with which the second group of supply holes communicate.

* * * * *